(12) United States Patent
Hsu

(10) Patent No.: US 8,379,409 B2
(45) Date of Patent: Feb. 19, 2013

(54) TOUCH PANEL

(75) Inventor: Jane Hsu, Taoyuan County (TW)

(73) Assignee: DerLead Investment Ltd., Taipei (TW)

( * ) Notice: Subject to any disclaimer, the term of this patent is extended or adjusted under 35 U.S.C. 154(b) by 258 days.

(21) Appl. No.: 12/964,895

(22) Filed: Dec. 10, 2010

(65) Prior Publication Data

US 2011/0157845 A1 Jun. 30, 2011

(30) Foreign Application Priority Data

Dec. 31, 2009 (TW) .............................. 98224828 U

(51) Int. Cl.
*H05K 9/00* (2006.01)

(52) U.S. Cl. .................... 361/818; 361/728; 361/790

(58) Field of Classification Search .......... 361/728–730, 361/790, 796, 799, 816, 818; 345/172–174, 345/156; 200/250, 257
See application file for complete search history.

(56) References Cited

U.S. PATENT DOCUMENTS

| | | | | |
|---|---|---|---|---|
| 4,990,900 | A * | 2/1991 | Kikuchi | 345/174 |
| 5,001,308 | A * | 3/1991 | Mori | 200/5 A |
| 5,406,399 | A * | 4/1995 | Koike | 349/58 |
| 5,898,426 | A * | 4/1999 | Kim | 345/173 |
| 5,943,043 | A * | 8/1999 | Furuhata et al. | 345/173 |
| 6,060,812 | A * | 5/2000 | Toda | 310/313 R |
| 7,283,185 | B2 * | 10/2007 | Hirakata et al. | 349/58 |
| 7,872,704 | B2 * | 1/2011 | Ooami | 349/58 |

* cited by examiner

*Primary Examiner* — Hung S Bui
(74) *Attorney, Agent, or Firm* — Rabin & Berdo, P.C.

(57) ABSTRACT

A touch panel is characterized in that one side of a top panel protrudes beyond a side of a bottom panel, signals of sensing areas or conductive layer on the top panel for sensing capacitive variation or voltage variation are transmitted to a bottom surface of the protruded side, signals of sensing areas or conductive layer on the bottom panel for sensing capacitive variation or voltage variation are transmitted to a bottom surface of the top panel through conductive adhesives and to the bottom surface of the protruded side, and the top panel has a flexible PCB formed on the bottom surface of the protruded side to receive those signals. As the flexible PCB is not sandwiched between the top and bottom panels, all layers of the touch panel can be uniformly and tightly bonded and touch insensitivity caused by air penetration into the touch panel can be prevented.

20 Claims, 5 Drawing Sheets

TOUCH PANEL

BACKGROUND OF THE INVENTION

1. Field of the Invention

The present invention relates to a touch panel, and more particularly to a touch panel with a relatively higher yield and a uniform thickness.

2. Description of the Related Art

Touch panels can be classified as capacitive touch panels, resistive touch panels, surface acoustic touch panels, infrared touch panels and the like in terms of touch panel technologies. Among them, the capacitive touch panels and the resistive touch panels take the leading position in market share. The technologies behind the capactive touch panels and the resistive touch panels determine the location of a touched point based on capactive and voltage variation generated at the touched point. Structurally, both touch panels commonly have an upper substrate and a lower substrate. The surfaces of the upper substrate and the lower substrate that face each other have an indium tin oxide (ITO) layer respectively formed on the surfaces to sense the capactive or voltage variation. To output the variation signals, each of the ITO layers is connected with one wire or multiple wires. One end of each of the wires extends to one of the two sides respectively located on the upper substrate and the lower substrate and facing each other. A flexible printed circuit board (PCB) is sandwiched between the upper substrate and the lower substrate and is connected with the ends of the wires to receive signals transmitted through the wires.

However, as the flexible PCB intervenes between the upper substrate and the lower substrate of the conventional touch panels, a thickness of the position where the flexible PCB is inserted between the upper substrate and the lower substrate inevitably increases, thereby causing a non-uniform thickness of the conventional touch panels. Such non-uniform thickness gives rise to adverse effect on the aesthetic appeal of the touch panels' appearance. Besides, gaps are easily formed at the portion of the touch panel at which the flexible PCB is located. Once air penetrates into the touch panels through the gaps, the operational sensitivity of the touch panel is reduced. Hence, the conventional touch panels are further structurally restricted.

SUMMARY OF THE INVENTION

An objective of the present invention is to provide a touch panel having a flexible PCB not mounted between a top panel and a bottom panel to secure a uniform thickness and airtight performance of the touch panel.

To achieve the foregoing objective, the touch panel has a bottom panel, an anisotropic conductive film, an insulating layer, a top panel and a flexible PCB.

The bottom panel has an EMI shielding layer, multiple lower sensing areas, multiple first lower ports, multiple second lower ports and multiple lower wires.

The EMI shielding layer is formed on a bottom surface of the bottom panel. The lower sensing areas are formed on a top surface of the bottom panel and are parallelly aligned in a first direction. Each of the lower sensing areas has multiple lower sensing units serially connected. Each of the first lower ports is formed on an edge of one of the outermost lower sensing units in the first direction. The second lower ports are collectively formed on a bordering portion of a side of the top surface of the bottom panel. A count of the second lower ports corresponds to that of the first lower ports. The lower wires are respectively connected between the first lower ports and the second lower ports.

The anisotropic conductive film is formed on the top surface of the bottom panel and covered on the second lower ports.

The insulating layer is formed on the top surface of the bottom panel.

The top panel is formed on the anisotropic conductive film and the insulating layer, is larger than the lower panel and has a protruded side, multiple upper sensing areas, multiple first upper ports, multiple second upper ports, multiple transfer ports and multiple lower wires.

The protruded side protrudes beyond the side of the bottom panel having the second lower ports thereon. The upper sensing areas are formed on a bottom surface of the top panel, are parallelly aligned in a second direction that is perpendicular to the first direction, and each of the upper sensing areas has multiple upper sensing units serially connected. Each of the first upper port is formed on an edge of one of the outermost upper sensing units in the second direction. The second upper ports are formed on the bottom surface of the top panel and extend to a bottom surface of the protruded side. A count of the second upper ports corresponds to that of the first upper ports. The transfer ports are formed on the bottom surface of the top panel and extend to the bottom surface of the protruded side. A count of the transfer ports corresponds to that of the second lower ports. One end of each of the transfer ports is located directly above a corresponding second lower port. The lower wires are respectively connected between the first upper ports and the second upper ports.

The flexible PCB is formed on the bottom surface of the top panel, is located on an edge of the bottom surface of the protruded side, and is electrically connected with second upper ports and the transfer ports.

In the aforementioned touch panel, signals of each of the lower sensing areas on the lower panel are transmitted to a corresponding second lower port through a corresponding lower wire. The anisotropic conductive adhesives respectively formed between the second lower ports and the transfer ports on the bottom surface of the top panel allow current flowing only in one direction. Each of the second lower ports is electrically connected with a corresponding transfer port formed above it through the anisotropic conductive adhesive. As a result, signals from the lower sensing areas can respectively be further transmitted to the transfer ports and then to the flexible PCB.

Alternatively, the touch panel has a bottom panel, a lower conductive layer, a separation layer, an insulating layer, an upper conductive layer and a flexible PCB.

The lower conductive layer is formed on a top surface of the bottom panel, and has at least one lower electrode. One end of each lower electrode extends to one side of the lower conductive layer.

The separation layer is formed on a top surface of the lower conductive layer.

The insulating layer is formed on a top surface of the lower conductive layer, surrounds a border of the separation layer, is covered on the lower electrodes, and has multiple conductive adhesives formed on locations of the insulating layer to respectively correspond to and contact with the lower electrodes.

The upper conductive layer is formed on top surfaces of the separation layer and the insulating layer, is larger than the lower panel, and has a protruded side, at least one upper electrode and multiple transfer ports. The protruded side protrudes beyond the side of the lower panel having the at least one lower electrode. The at least one upper electrode is formed on a bottom surface of the upper conductive layer and extends alongside three sides of the bottom surface of the upper conductive layer. A contact end of each of the at least one upper electrode extends to an edge of the protruded side. The transfer ports are formed on a bottom surface of the edge of the protruded side. A count of the transfer ports corresponds to that of the lower electrodes, and each of the transfer ports is contacted with one of the conductive adhesives on the insulating layer.

The top panel is formed on a top surface of the upper conductive layer.

The flexible PCB is formed on the bottom surface of the upper conductive layer and on the edge of the protruded side, and is electrically connected with the transfer ports and the contact end of each of the at least one upper electrode.

In the alternative touch panel, signals of the lower conductive layer on the bottom panel are respectively transmitted to the conductive adhesives through the lower electrodes, and to the flexible PCB after being transmitted to the transfer ports on the bottom surface of the upper conductive layer.

In sum, as the flexible PCB is mounted on the bottom surface of the top panel and not sandwiched between the top panel and the bottom panel, a uniform thickness of the touch panel can be maintained to increase aesthetic appeal of the touch panel. Additionally, all layers of the touch panel are tightly bonded and the airtight performance prevents air from penetrating into the touch panel to effectively avoid touch sensitivity reduction caused by air penetration into gaps between the flexible PCB and the top panel and/or the bottom panel.

Other objectives, advantages and novel features of the invention will become more apparent from the following detailed description when taken in conjunction with the accompanying drawings.

DETAILED DESCRIPTION OF THE INVENTION

Figure 1:
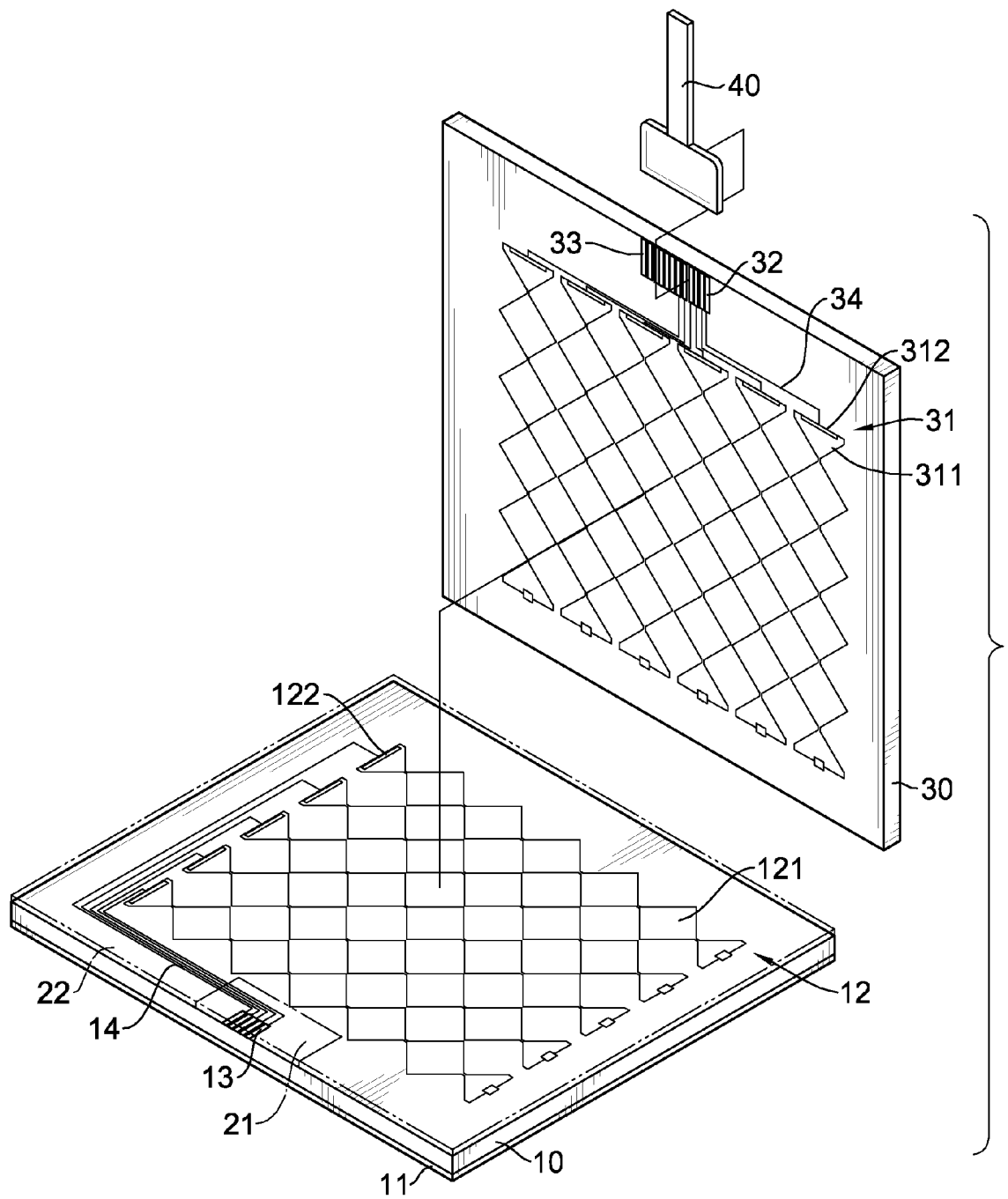
FIG. 1 is an exploded perspective view of an embodiment of a touch panel in accordance with the present invention.
Figure 2:
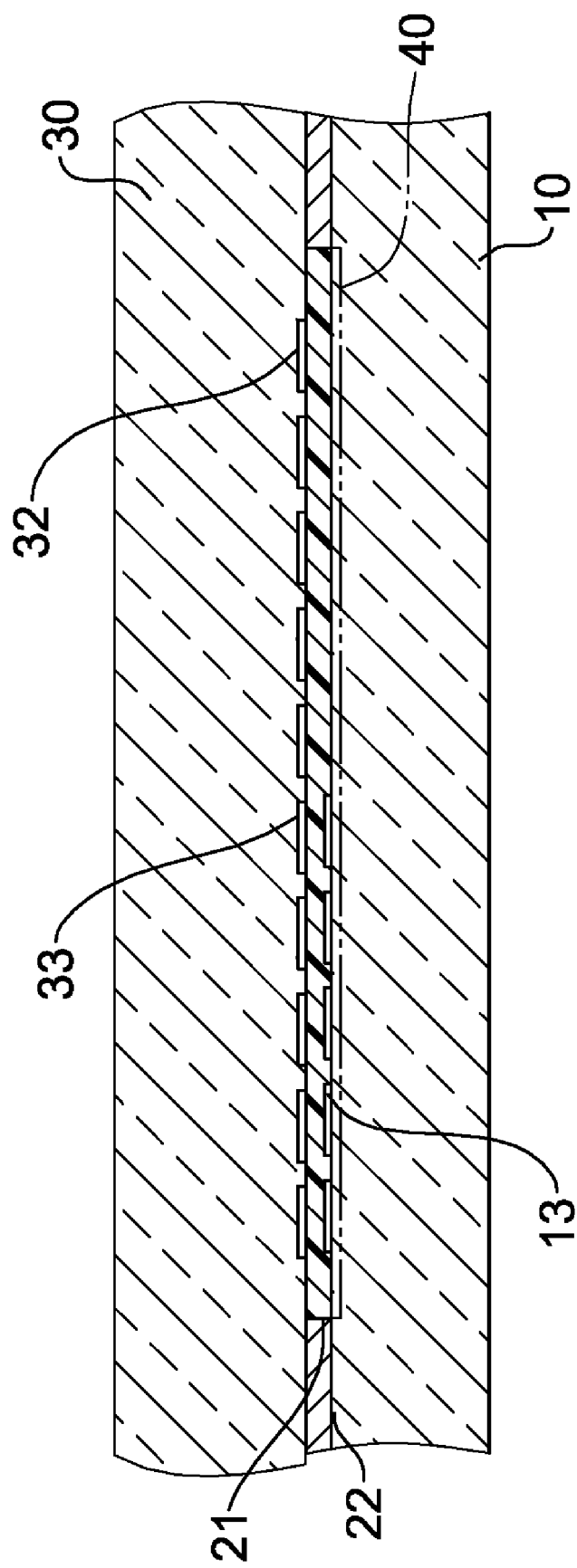
FIG. 2 is a side view in partial section of the touch panel in FIG. 1.
Figure 3:
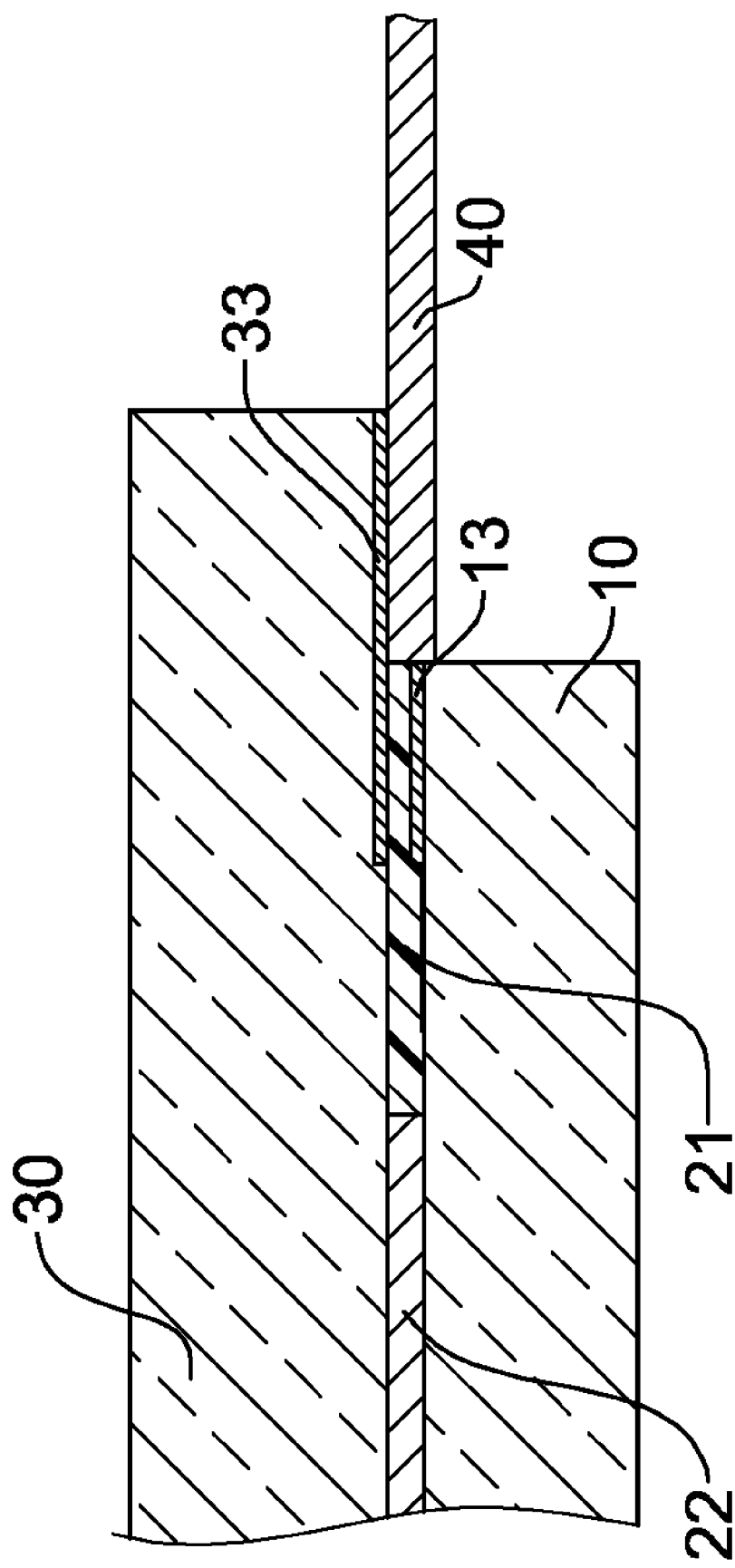
FIG. 3 is another side view in partial section of the touch panel in FIG. 1.

The present invention can be applied to either a capacitive touch panel or a resistive touch panel. With reference to FIGS. 1 to 3, a capacitive touch panel has a bottom panel 10, an anisotropic conductive film 21, an insulating layer 22, a top panel 30 and a flexible PCB 40.

The bottom panel 10 has an EMI (electromagnetic interference) shielding layer 11, multiple lower sensing areas 12, multiple first lower ports 122, multiple second lower ports 13 and multiple lower wires 14. The EMI shielding layer 11 is formed on a bottom surface of the bottom panel 10 and is composed of ITO. The lower sensing areas 12 are formed on a top surface of the bottom panel 10, parallelly align in a first direction, and each of the lower sensing areas 12 has multiple lower sensing units 121 serially connected and composed of ITO. Each of the first lower ports 122 is formed on an edge of one of the outermost lower sensing units 121 in the first direction, and is formed by a conductive material. The second lower ports 13 are collectively formed on a bordering portion of a side of the top surface of the bottom panel 10, are composed of conductive material, and the count of the second lower ports 13 corresponds to that of the first lower ports 122. The lower wires 14 are formed on the top surface of the bottom panel and are respectively connected between the first lower ports 122 and the second lower ports 13 and may be conductive silver wires.

The anisotropic conductive film 21 is formed on the top surface of the bottom panel 10 and is covered on the second lower ports 13. To lower the difficulty in alignment, the anisotropic conductive film 21 can be sufficiently large to cover the second lower ports 13 but cover no lower sensing unit 121.

The insulating layer 22 is transparent and is formed on the top surface of the bottom panel 10.

The top panel 30 is transparent, is formed on the anisotropic conductive film 21 and the insulating layer 22, and has multiple upper sensing areas 31, multiple first upper ports 312, multiple second upper ports 32, multiple transfer ports 33 and multiple upper wires. The top panel 30 is larger than the lower panel 10 and has a protruded side protruding beyond the side of the bottom panel 10 having the second lower ports 13 thereon.

The upper sensing areas 31 are formed on a bottom surface of the top panel 30, parallelly align in a second direction that is perpendicular to the first direction, and each of the upper sensing areas 31 has multiple upper sensing units 311 serially connected, corresponding to a portion unfilled by the lower sensing units 121 of the lower panel 10, and composed of ITO. Each of the first upper port 312 is formed on an edge of one of the outermost upper sensing units 311 in the second direction, and is formed by a conductive material. The second upper ports 32 and the transfer ports 33 are collectively formed on the bottom surface of the top panel 30 and extend to a bottom surface of the protruded side of the top panel 30, and are composed of conductive material. The count of the second upper ports 32 corresponds to that of the first upper ports 312. The count of the transfer ports 33 corresponds to that of the second lower ports 13. The upper wires 34 are formed on the bottom surface of the top panel 30, are respectively connected between the first upper ports 312 and the second upper ports 32, and may be conductive silver wires. One end of each of the transfer ports 33 corresponds to and is electrically connected with a corresponding second lower port 13.

A flexible PCB 40 is mounted on the bottom surface of the protruded side of the top panel 30, and is electrically connected with second upper ports 32 and the transfer ports 33.

In the foregoing capacitive touch panel, signals of each of the upper sensing areas 31 are transmitted to a corresponding second upper port 32 through a corresponding upper wire 34 and are further transmitted to the flexible PCB 40. Signals of each of the lower sensing areas are transmitted to a corresponding second lower port 13 through a corresponding lower wire 14. For sake of the characteristic of the anisotropic conductive film 21 allowing current to flow in only one direction, each of the second lower ports 13 is electrically connected with a corresponding transfer port 33 formed directly above it through the anisotropic conductive film 21. Hence, signals of each of the lower sensing area 12 are further transmitted to a corresponding transfer port 33 through the anisotropic conductive film 21 and then to the flexible PCB 40.

Figure 4:
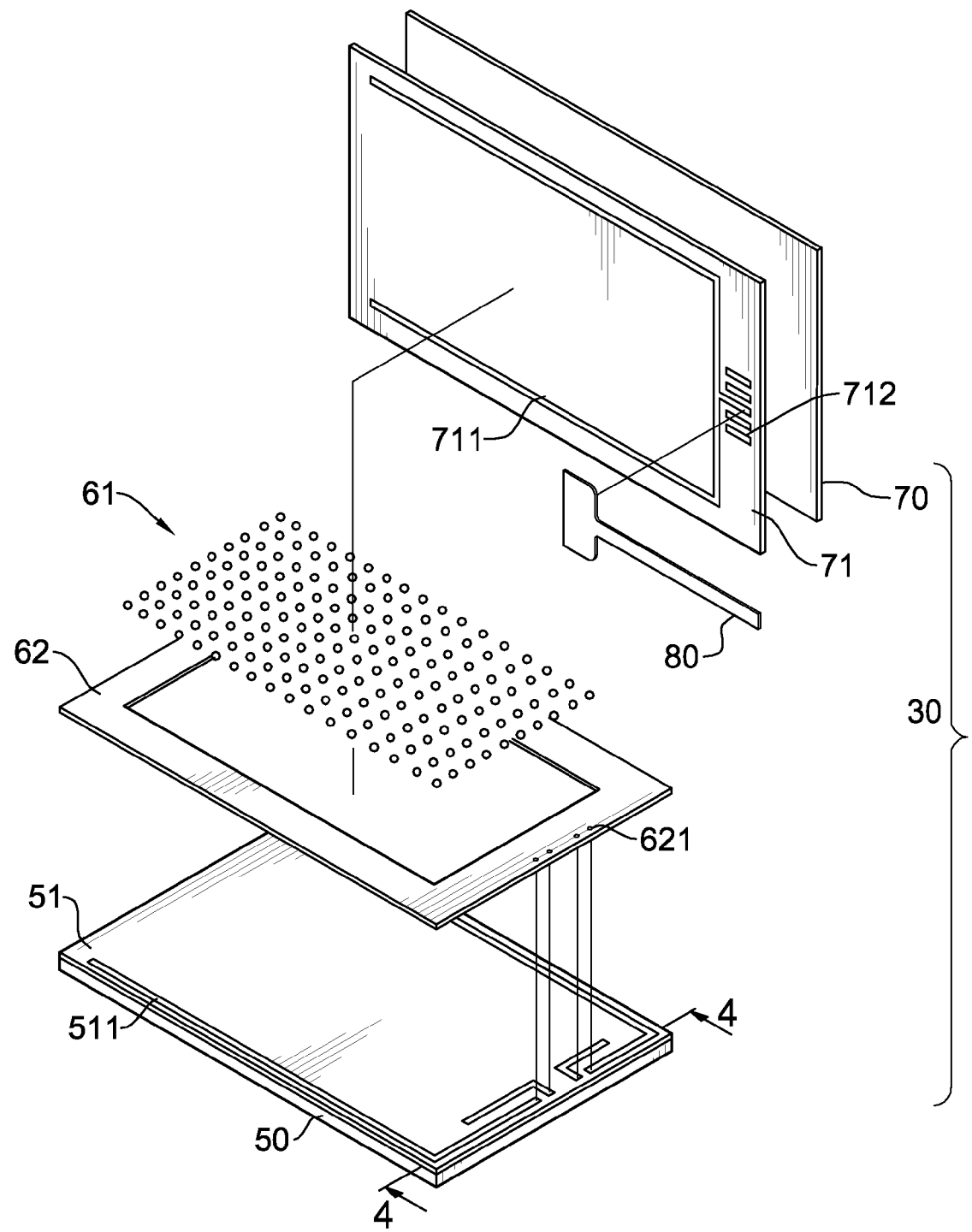
FIG. 4 is an exploded perspective view of another embodiment of a touch panel in accordance with the present invention.
Figure 5:
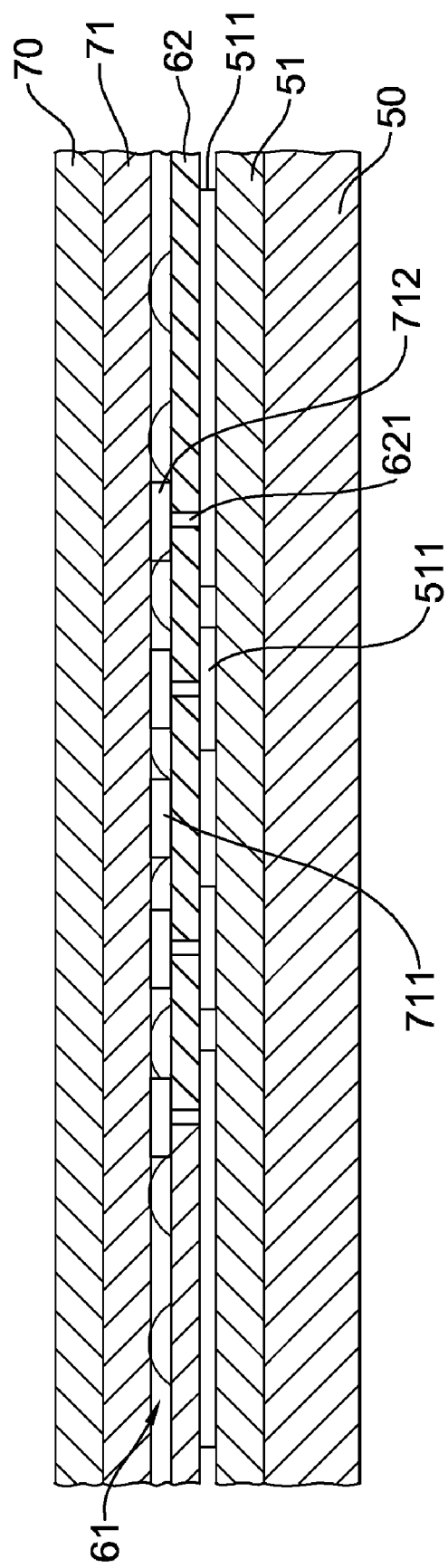
FIG. 5 is a side view in partial section of the touch panel in FIG. 4.

With reference to FIGS. 4 and 5, a resistive touch panel has a bottom panel 50, a lower conductive layer 51, a separation layer 61, an insulating layer 62, an upper conductive layer 71, a top panel 70 and a flexible PCB 80.

The bottom panel 50 is transparent. The lower conductive layer 51 is transparent, is formed on a top surface of the bottom panel 50, is composed of ITO, and has at least one lower electrode 511. The count of the lower electrode 511 is chosen based on operation requirement. Given five-wire touch panel as an example, four lower electrodes 511 are formed on the lower conductive layer 51. The lower electrodes 511 may be silver electrodes. One end of each of the lower electrodes 511 extends to one side of the lower conductive layer 51.

The separation layer 61 and the insulating layer 62 are formed on the top surface of the lower conductive layer 51. The insulating layer 62 surrounds a boundary of the separation layer 61 and is covered on the lower electrodes 511. The insulating layer 62 has multiple conductive adhesives 621 formed on locations of the insulating layer 62 to respectively correspond to and contact with the lower electrodes 511. The conductive adhesives 621 may be anisotropic conductive adhesives.

The upper conductive layer 71 is transparent, is formed on top surfaces of the separation layer 61 and the insulating layer 62, and is composed of ITO. The upper conductive layer 71 is larger than the lower panel 50. The upper conductive layer 71 has a protruded side, at least one upper electrode 711 and multiple transfer ports 712. The protruded side protrudes beyond the side of the bottom panel 50 having the at least one lower electrode 511. The at least one upper electrode 711 is formed on a bottom surface of the upper conductive layer 71 and extends alongside three sides of the bottom surface of the upper conductive layer 71. Given the same 5-wire touch panel, an upper electrode 7111 is formed on the bottom surface of the upper conductive layer 71. A contact end of the upper electrode 711 extends to a bottom surface of the protruded side of the upper conductive layer 71. The upper conductive layer 71 further has multiple transfer ports 712 formed on the bottom surface of the protruded side. The count of the transfer ports 712 corresponds to that of the lower electrodes 511. Each of the transfer ports 712 is contacted with one of the conductive adhesives 621 on the insulating layer 62.

The top panel 70 is transparent and is formed on a top surface of the upper conductive layer 71. The flexible PCB 80 is formed on the bottom surface of the upper conductive layer 71 and on the bottom surface of the protruded side, and is electrically connected with the transfer ports 712 and the contact end of the upper electrode 711.

In the foregoing resistive touch panel, signals of the upper conductive layer 71 on the top panel 70 are directly transmitted to the flexible PCB 80 through the upper electrode 711. Signals of the lower conductive layer 51 on the bottom panel 50 are respectively transmitted to the conductive adhesives 621 through the lower electrodes 511, and then are transmitted to the flexible PCB 80 after being transmitted to the transfer ports 712 on the bottom surface of the upper conductive layer 71.

In the touch panels of the present invention, all transfer ports 33, 712 and the second upper ports 32 or the contact end of the upper electrode 711 are collectively formed on the bottom surface of the top panel 30, 70, terminals of the flexible PCB 40, 80 can be easily aligned with the transfer ports 33, 712 and the second upper ports 32 or the contact end of the upper electrode 711 respectively. Besides, as the flexible PCB 40, 80 is formed on the bottom surface of the top panel 30, 70 and not between the top panel 30, 70 and the bottom panel 10, 50, the uniform thickness of the touch panel enhances the aesthetic appeal of the appearance of the touch panel. Meanwhile, all layers of the touch panels of the present invention are tightly bonded and have a good airtight effect, thereby effectively solving the drawback of the touch sensitivity reduction resulting from air penetration into gaps between the flexible PCB and the top surface and/or the bottom panels.

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:

1. A touch panel, comprising:
 a bottom panel having:
   an EMI shielding layer formed on a bottom surface of the bottom panel;
   multiple lower sensing areas formed on a top surface of the bottom panel, parallelly aligned in a first direction, each of the lower sensing areas having multiple lower sensing units serially connected;
   multiple first lower ports, each of the first lower ports formed on an edge of one of the outermost lower sensing units in the first direction;
   multiple second lower ports collectively formed on a bordering portion of a side of the top surface of the bottom panel, wherein a count of the second lower ports corresponds to that of the first lower ports; and
   multiple lower wires formed on the top surface of the bottom panel and respectively connected between the first lower ports and the second lower ports;
 an anisotropic conductive film formed on the top surface of the bottom panel and covered on the second lower ports;
 an insulating layer formed on the top surface of the bottom panel;
 a top panel formed on the anisotropic conductive film and the insulating layer, being larger than the lower panel and having:
   a protruded side protruding beyond the side of the bottom panel having the second lower ports thereon;
   multiple upper sensing areas formed on a bottom surface of the top panel, parallelly aligned in a second direction that is perpendicular to the first direction, and each of the upper sensing areas having multiple upper sensing units serially connected;
   multiple first upper ports, each of the first upper ports formed on an edge of one of the outermost upper sensing units in the second direction;
   multiple second upper ports formed on the bottom surface of the top panel and extending to a bottom surface of the protruded side, wherein a count of the second upper ports corresponds to that of the first upper ports;
   multiple transfer ports formed on the bottom surface of the top panel and extending to the bottom surface of the protruded side, wherein a count of the transfer ports corresponds to that of the second lower ports, and one end of each of the transfer ports corresponds to and is electrically connected with a corresponding second lower port; and
   multiple upper wires formed on the bottom surface of the top panel and respectively connected between the first upper ports and the second upper ports; and
 a flexible PCB mounted on the bottom surface of the protruded side, and electrically connected with the second upper ports and the transfer ports.

2. The touch panel as claimed in claim 1, wherein the upper sensing units correspond to a portion unfilled by the lower sensing units of the lower panel.

3. The touch panel as claimed in claim 2, wherein the upper sensing units and the lower sensing units are composed of indium tin oxide (ITO).

4. The touch panel as claimed in claim 3, wherein the lower wires and the upper wires are conductive silver wires.

5. The touch panel as claimed in claim 2, wherein the lower wires and the upper wires are conductive silver wires.

6. The touch panel as claimed in claim 2, wherein the EMI shielding layer is composed of ITO.

7. The touch panel as claimed in claim 3, wherein the EMI shielding layer is composed of ITO.

8. The touch panel as claimed in claim 1, wherein the upper sensing units and the lower sensing units are composed of indium tin oxide (ITO).

9. The touch panel as claimed in claim 8, wherein the lower wires and the upper wires are conductive silver wires.

10. The touch panel as claimed in claim 8, wherein the EMI shielding layer is composed of ITO.

11. The touch panel as claimed in claim 1, wherein the lower wires and the upper wires are conductive silver wires.

12. The touch panel as claimed in claim 1, wherein the EMI shielding layer is composed of ITO.

13. A touch panel, comprising:
a bottom panel;
a lower conductive layer formed on a top surface of the bottom panel, and having at least one lower electrode, wherein one end of each lower electrode extends to one side of the lower conductive layer;
a separation layer formed on a top surface of the lower conductive layer;
an insulating layer formed on the top surface of the lower conductive layer, surrounding a border of the separation layer, covered on the lower electrodes, and having multiple conductive adhesives formed on locations of the insulating layer to respectively correspond to and contact with the lower electrodes;
an upper conductive layer formed on top surfaces of the separation layer and the insulating layer, being larger than the lower panel, and having:
a protruded side protruding beyond the side of the lower panel having the at least one lower electrode; at least one upper electrode formed on a bottom surface of the upper conductive layer and extending alongside three sides of the bottom surface, wherein a contact end of each of the at least one upper electrode extends to a bottom surface of the protruded side of the upper conductive layer; and
multiple transfer ports formed on the bottom surface of the protruded side, wherein a count of the transfer ports corresponds to that of the lower electrodes, and each of the transfer ports is contacted with one of the conductive adhesives on the insulating layer;
a top panel formed on a top surface of the upper conductive layer; and
a flexible PCB mounted on the bottom surface of the protruded side, and electrically connected with the transfer ports and the contact end of each of the at least one upper electrode.

14. The touch panel as claimed in claim 13, wherein the upper electrodes and the lower electrodes are silver electrodes.

15. The touch panel as claimed in claim 14, wherein the upper conductive layer and the lower conductive layer are composed of ITO.

16. The touch panel as claimed in claim 15, wherein the conductive adhesives are anisotropic conductive adhesives.

17. The touch panel as claimed in claim 14, wherein the conductive adhesives are anisotropic conductive adhesives.

18. The touch panel as claimed in claim 13, wherein the upper conductive layer and the lower conductive layer are composed of ITO.

19. The touch panel as claimed in claim 18, wherein the conductive adhesives are anisotropic conductive adhesives.

20. The touch panel as claimed in claim 13, wherein the conductive adhesives are anisotropic conductive adhesives.

* * * * *